United States Patent
Ferraro

(10) Patent No.: US 8,762,799 B2
(45) Date of Patent: Jun. 24, 2014

(54) METHOD FOR CHECKING THE FUNCTIONAL ABILITY OF A MEMORY ELEMENT

(75) Inventor: Franco Ferraro, Schwörstadt (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 115 days.

(21) Appl. No.: 13/580,548

(22) PCT Filed: Jan. 28, 2011

(86) PCT No.: PCT/EP2011/051230
§ 371 (c)(1),
(2), (4) Date: Aug. 22, 2012

(87) PCT Pub. No.: WO2011/104065
PCT Pub. Date: Sep. 1, 2011

(65) Prior Publication Data
US 2012/0324301 A1 Dec. 20, 2012

(30) Foreign Application Priority Data
Feb. 24, 2010 (DE) .......................... 10 2010 002 309

(51) Int. Cl.
*G11C 29/00* (2006.01)
(52) U.S. Cl.
USPC .......................................... 714/718; 714/720
(58) Field of Classification Search
USPC .................................................. 714/718, 720
See application file for complete search history.

(56) References Cited

U.S. PATENT DOCUMENTS

| | | | | |
|---|---|---|---|---|
| 5,461,588 A | * | 10/1995 | Sardeson et al. | 365/201 |
| 2002/0007451 A1 | * | 1/2002 | Cho et al. | 712/43 |
| 2011/0218654 A1 | * | 9/2011 | Trautmann | 700/31 |

FOREIGN PATENT DOCUMENTS

| | | |
|---|---|---|
| DE | 10128996 A1 | 12/2002 |
| EP | 1108984 A1 | 6/2001 |
| WO | 2011104065 A1 | 9/2011 |

OTHER PUBLICATIONS

German Search Rpt, Aug. 10, 2010, German Patent Office, Munich.
Inti Search Rpt, Mar. 29, 2011, The Netherlands.
Eng Trans of IPR, Sep. 7, 2012, WIPO, Switzerland.

* cited by examiner

*Primary Examiner* — Guy Lamarre
(74) *Attorney, Agent, or Firm* — Bacon & Thomas, PLLC

(57) ABSTRACT

A method for checking the functional ability of a memory element having a stack memory, wherein the stack memory occupies a defined region within the memory element. A stack memory pointer is defined, which displays, in the form of an address, a stack memory position, from which data are currently being removed or to which data are currently being written. In the memory element, a section of defined length arranged outside a memory region to be checked is delimited and used as an auxiliary memory; the current address of the stack memory pointer is stored before the start of a test program for checking the memory element and the stack memory pointer is then assigned an address associated with the auxiliary memory, so that during the test program the auxiliary memory is used as working memory; and after terminating the test program the stack memory pointer is reassigned the address of that position, which it displayed before the start of the test program.

11 Claims, 1 Drawing Sheet

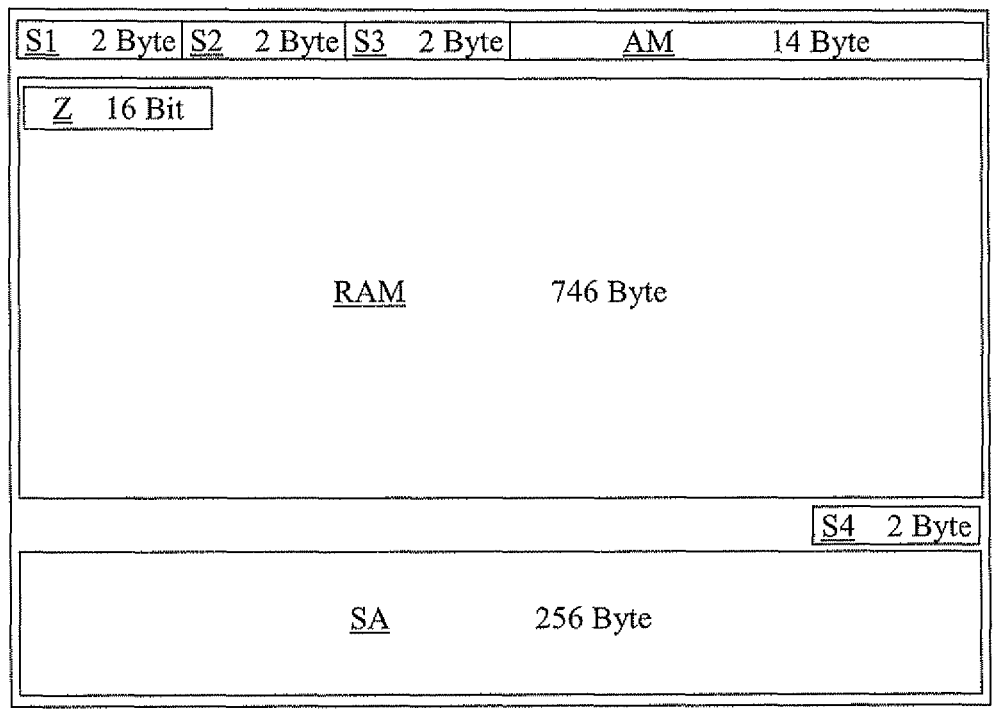

METHOD FOR CHECKING THE FUNCTIONAL ABILITY OF A MEMORY ELEMENT

TECHNICAL FIELD

The present invention relates to a method for checking functional ability of a memory element having a stack memory, wherein the stack memory occupies a defined region within the memory element, and wherein a stack memory pointer is defined, which displays, in the form of an address, a stack memory position, from which data are currently being removed or to which data are currently being written. Such a method is used, for example, in the case of an intrinsically safe measuring device for determining and monitoring process variables. The memory element is a volatile memory, such as, for example, RAM—Random Access Memory—or a non-volatile memory, for example, an EEPROM or a flash memory.

BACKGROUND DISCUSSION

Different methods for checking electronic data memories are known from the state of the art. A commonly used method is the cyclic redundancy check. In this method, in the simplest case, a signature is formed for each data block of a certain size and attached to the data block. The same method is applied anew on the data block including the attached signature. After this operation the result should be zero. If it deviates from zero, an error has occurred in the memory.

Such a test method can, however, only be applied if the content of the data block does not change during the test. Since the program for performing such a test is, most often, modularly constructed and requires memory capacity, it is necessary to exclude from the test the area currently used for memory. This is relatively complicated, fraught with risk and takes time for performing the test program. In order not to degrade the functional ability of the device, in which the memory element is applied, however, a test program should take as little time as possible.

SUMMARY OF THE INVENTION

An object of the invention is to provide a method, which enables checking functional ability of a complete area of a memory element coherently by means of a modularly built program.

The object is achieved by features including that: in the memory element, a first section of defined length is delimited and used for storing at least one signature, which contains data relevant for checking functional ability of the memory element; in the memory element a second section of defined length is delimited and used as an auxiliary memory; wherein positions of the first section and the second section are selected in such a manner that the first position and the second section adjoin one another and are arranged outside of a memory region to be checked; the memory region to be checked is checked by a modularly built test program; wherein current address of the stack memory pointer is stored before start of the test program and the stack memory pointer is then assigned an address associated with the auxiliary memory, so that during the test program the auxiliary memory is used as working memory; and after terminating the test program the stack memory pointer is reassigned the address of that position, which it displayed before the start of the test program.

The additional auxiliary memory enables that, during the running of the test program, the stack memory—also referred to as the stack—does not have be accessed so that its cells do not change. In this way, the test program can test the total memory region in one run, which means a saving of time. During the test phase, the program switches to the auxiliary memory, so that the stack memory with the remaining memory region to be checked can be tested right straight through. The auxiliary memory is preferably likewise a stack memory using the first in—last out—principle.

Preferably, three signatures are formed and stored. The first signature is formed over the total memory region to be checked and reflects the state at the beginning of the test program. The second signature is formed over the same region, however, without the current test cell. The third signature is a signature that can change. It is continuously recalculated during the testing of a test cell and compared with the second signature during the testing of the test cell or, at the end of the testing of the test cell, with the first signature. If, in each case, the signatures compared with one another agree, no memory defect has arisen in the test cell. The length of a signature, i.e. the number of bits, depends on the size of the memory region to be checked.

After starting, the test program checks all test cells one after the other, so that, by the end of the test program, all test cells have been checked, or the test program is restarted for each test cell, so that between checking the individual test cells there lies a specific time interval, during which the intended functions of the memory element are executed. If the memory element is part of the electronics of a measuring device, such a function is, for example, the storing of measurement data.

In a first embodiment of the solution of the invention, a transparent GALPAT—galloping pattern—is applied as test program. Involved here is a diagnostic method, which is performed during the run time of the device, i.e. during normal operation of the memory element, and in the case of which a securing of the memory region to be checked before the function check is not required. This method is relatively complicated, it is true; however, it has a high defect discovery probability of over 99%. This is required, for example, when the memory element is part of a device, which has to satisfy high safety requirements, e.g. SIL 3.

According to an additional embodiment of the method of the invention, for the case, in which the first section—the signature—lies before the second section—the auxiliary memory—, the second section is written beginning from the end, so that any overflow gets written into the first section. In other words, the first section for the signature has a lower valued address range than the second section for the auxiliary memory and the auxiliary memory is written beginning with the highest valued address in its address range. If an overflow or "stack overflow" occurs, which means, if the memory capacity reserved for the auxiliary memory is not sufficient, then the next lower address is overwritten. Since this is already written with of a part of the signature, the signature is changed thereby. This is immediately recognized as an error. Correspondingly, for the case, in which the first section is arranged behind the second section, the second section is written beginning from the front, so that an overflow, if it occurs, is written into the first section.

Another embodiment of the invention provides that the size of the auxiliary memory is considerably smaller than the size of the stack memory. The auxiliary memory is only used as a working memory during the checking of the memory element by the test program. Therefore, a relatively small size, i.e. a low memory capacity suffices, so that the usable memory region does not become noticeably smaller.

In an embodiment, the size of the auxiliary memory is selected in such a manner that it amounts to between 5 and 10 percent of the size of the stack memory.

Another embodiment provides that in the case of a memory element having a memory size of 1024 bytes, 6 bytes are delimited for the signature and 14 bytes for the auxiliary memory. The memory capacity lost due to the additional auxiliary memory is negligibly small in this distribution.

A preferred embodiment provides that the functional ability of a RAM—Random Access Memory—is checked.

In an additional embodiment, the functional ability of the auxiliary memory and the signature is checked before beginning the test program. The functional ability of the auxiliary memory and the signature is preferably checked using a simple test program, which is less complicated than the performing of the checking of the actual memory region and has an acceptable discovery rate for bit errors. In this way, time is saved in the testing of the auxiliary memory and the signature.

In a preferred embodiment, it is checked at the termination of the test program whether the current position of the stack memory pointer in the auxiliary memory agrees with the starting position at the start of the test program. This condition must be fulfilled, if the auxiliary memory is a stack memory. The test program is preferably designed in such a manner that the stack memory pointer is increased upon the invoking of a function and lowered back thereafter. If additional memory capacity is required, the stack memory pointer is correspondingly increased, however, set back as soon as the stored data has again been read out. In this way, the starting position of the stack memory pointer at the start of the test program and the end position at the termination of the test program are identical. In a comparison of the end position with the starting position, it can be determined from a deviation that the test program has run incorrectly.

An embodiment of the invention provides that a program run control is performed, which checks whether the entire memory region to be checked was indeed checked by the test program. For example, signatures are added up at specific locations of the test program. At the end of the test program this sum must correspond to a specific value. If the sum deviates from this value, an error has occurred in the test program and the locations of the memory region to be checked were checked incorrectly or incompletely. Of course, also other program run controls can alternatively be performed.

BRIEF DESCRIPTION OF THE DRAWING

The invention will now be explained in greater detail based on the drawing, the sole FIGURE of which shows as follows:

FIG. 1 is a schematic representation of the partitioning of a RAM.

DETAILED DISCUSSION IN CONJUNCTION WITH THE DRAWINGS

FIG. 1 schematically shows the partitioning of a memory element into sections having different functions using the example of a RAM. The section marked RAM is, in such case, the portion of the RAM, to which no separate function should be attributed and, in a manner of speaking, represents the actual RAM region. The size of the respective sections, in such case, is to be understood only as an example, wherein the ratios of the sizes of the sections to one another are especially advantageous in such an embodiment.

The first section contains three signatures, which are formed and stored by the test program: two reference signatures S1 and S2, as well as the temporary signature S3. Their meaning will be explained in connection with the test program. The three signatures S1, S2, S3 are equally long, wherein their length depends on the size of the RAM region to be checked. Thus, for example, a 16 bit signature suffices for a memory size of 4 kilobytes, in order to attain a sufficiently high error discover rate.

The test program for checking functional ability of the RAM is to be chosen from the state of the art corresponding to the respective requirements for error discovery rate and the possible time consumed. Especially suitable are test programs, in which a backup of the content of the RAM is not required. In order to achieve a high safety standard a transparent GALPAT—galloping pattern—is especially suitable. In such case, a first reference signature S1 is formed over the total RAM region to be checked. A second signature S2 is formed for all cells to be checked with the exception of the cell to be checked currently, the test cell Z. Then the content of the test cell is inverted and the content of the remaining cells is checked by forming for these a temporary signature S3, which must agree with the second signature S2. After each read access of one of the remaining cells, the content of test cell Z is checked. After a complete run through, test cell Z is inverted again and the same method is applied to test cell Z with the restored content. This is repeated for each cell as test cell Z. The size of test cell Z is preferably determined by the architecture of the RAM, i.e. in the case of a 16 bit architecture, the size of the test cell is likewise 16 bits. In this way an especially efficient performing of the function checking is enabled.

In addition to the described transparent GALPAT, other test programs are also suited for function checking RAM. For example, a test cell can be written with a specific pattern, followed by checked whether the content is reproduced after a double inversion. For this, however, a backup of the original content of the test cell is required before the start of the test program; this leads to more time needed for performing the function checking.

The second section of the RAM is associated with the auxiliary memory AM ("auxiliary stack"). This replaces the stack memory SA ("stack") during the running of the test program and is not part of the RAM region to be checked. Preferably, the functional ability of auxiliary memory AM is, however, likewise checked by a separate program.

Following the memory space for the auxiliary memory AM are the actual RAM region, as well as the stack memory SA. These two sections form the RAM region to be checked. Between the RAM region and stack memory SA lies another signature S4, which is not changed in the RAM during normal operation, i.e. the running of a program. Signature S4 is regularly checked for changes. Changes in signature S4 occur when the memory capacity in stack memory SA is not sufficient and, consequently, the nearest cell is written. Since stack memory SA is written from back to front, i.e. beginning with the highest valued address, such nearest cell is in the region of signature S4. An overflow of stack memory SA can, thus, be detected.

The cells to be checked must be constant during the running of the test program. In order to be able to check the locations of stack memory SA, the test program, consequently, does not use stack memory SA but instead auxiliary memory AM, which is preferably likewise embodied as a stack memory. For this, in the beginning of the test program, the stack memory pointer, also called a stack pointer, which displays the address, from which data are currently read out or to which data are currently written, is transferred from stack memory SA to auxiliary memory AM. The address in stack memory SA, which displays the stack memory pointer at this point in time, is stored in stack memory SA or auxiliary memory AM so that the stack memory pointer can again be set back to this position at the termination of the test program. The stack memory pointer shows the highest valued address of auxiliary memory AM at the beginning of the test program. During the test program, correspondingly lower addresses are assigned to the stack memory pointer. If the memory size of auxiliary memory AM does not suffice, thus, temporary signature S3 is written into, which leads to an error report. An overflow of auxiliary memory AM, thus, is automatically recognized.

Preferably, the locations to be checked are not tested directly one after the other, but only one test cell is tested per time interval, e.g. per second. The test program is thus interrupted after checking one test cell Z or the test program is restarted for each test cell Z. The stack memory pointer is correspondingly frequently shifted between stack memory SA and auxiliary memory AM. Between checking the individual test cells, the intended functions of the RAM are executed, for example, the saving of measurement data. The interruption offers the advantage that further function tests, which change the cells of the stack memory and consequently cannot take place during the performing of the RAM test, must not be stopped for a long time. An example of another such function checking is the checking of stack signature S4 for the diagnosis of a stack overflow. By alternating between normal operation and a memory function test, thus, a maximum reliability relative to discovering errors is assured.

The invention claimed is:

1. A method for checking the functional ability of a memory element having a stack memory, wherein the stack memory occupies a defined region within the memory element, and wherein a stack memory pointer is defined, which displays, in the form of an address, a stack memory position, from which data are currently being removed or to which data are currently being written, comprising the steps of:

delimiting in the memory element, a first section of defined length using the first section for storing at least one signature, which contains data relevant for checking functional ability of the memory element;

delimiting in the memory element, a second section of defined length and using the second section as an auxiliary memory, wherein positions of the first section and the second section are selected in such a manner that the first section and the second section adjoin one another and are arranged outside of a memory region to be checked;

checking the memory region to be checked by a modularly built test program, wherein current address of the stack memory pointer is stored before start of the test program and the stack memory pointer is then assigned an address associated with the auxiliary memory, so that during the test program the auxiliary memory is used as working memory; and after terminating the test program the stack memory pointer is reassigned the address of that position, which it displayed before the start of the test program.

2. The method as claimed in claim 1, wherein:

a transparent GALPAT—galloping pattern—is applied as test program.

3. The method as claimed in claim 1, wherein:

for the case, in which the first section lies before the second section, the second section is written from back to front, so that any overflow gets written into the first section.

4. The method as claimed in claim 1, wherein:

for the case, in which the first section is arranged behind the second section, the second section is written from front to back, so that any overflow gets written into the first section.

5. The method as claimed in claim 1, wherein:

the size of the auxiliary memory is considerably smaller than the size of the stack memory (SA).

6. The method as claimed in claim 5, wherein:

the size of the auxiliary memory is selected in such a manner that it amounts to between 5 and 10 percent of the stack memory (SA).

7. The method as claimed in claim 1, wherein:

in the case of a memory element having 1024 bytes, 6 bytes delimited for the signature and 14 bytes for the auxiliary memory.

8. The method as claimed in claim 1, wherein:

the functional ability of a RAM—Random Access Memory—is checked.

9. The method as claimed in claim 1, wherein:

the functional ability of the auxiliary memory and the signature is checked before beginning the test program.

10. The method as claimed in claim 1, wherein:

at the termination of the test program, it is checked whether the current position of the stack memory pointer in the auxiliary memory agrees with the starting position at the start of the test program.

11. The method as claimed in claim 1, wherein:

a program run control is performed, which checks whether the entire memory region to be checked was checked by the test program.

* * * * *